United States Patent [19]

Ipri

[11] 4,282,556
[45] Aug. 4, 1981

[54] INPUT PROTECTION DEVICE FOR INSULATED GATE FIELD EFFECT TRANSISTOR

[75] Inventor: Alfred C. Ipri, Princeton, N.J.

[73] Assignee: RCA Corporation, New York, N.Y.

[21] Appl. No.: 41,085

[22] Filed: May 21, 1979

[51] Int. Cl.³ ............................................... H02H 3/22
[52] U.S. Cl. ....................................... 361/56; 361/91; 361/111; 307/302; 307/303
[58] Field of Search ................... 361/56, 91, 110, 111; 307/303, 304

[56] References Cited

U.S. PATENT DOCUMENTS

| | | |
|---|---|---|
| 3,512,058 | 5/1970 | Khajezadeh et al. ................... 357/41 |
| 3,712,995 | 1/1973 | Steudel ................................. 307/304 |
| 3,947,727 | 3/1976 | Stewart ................................. 361/91 |
| 4,037,140 | 7/1977 | Eaton, Jr. ............................. 361/56 |
| 4,131,928 | 12/1978 | Davis et al. ......................... 361/56 |

FOREIGN PATENT DOCUMENTS 2348643 4/1974 Fed. Rep. of Germany ............. 361/56
2544438 4/1976 Fed. Rep. of Germany ............. 361/56

OTHER PUBLICATIONS

"Fundamentals of COS/MOS Integrated Circuits", by Bishop et al; Apr. 1974, Solid State Technology-Magazine, pp. 85-89.

Primary Examiner—Patrick R. Salce
Attorney, Agent, or Firm—Birgit E. Morris; D. S. Cohen; Lawrence P. Benjamin

[57] ABSTRACT

An input protection device comprising at least one pair of N and P type MOSFETs having their conduction paths series connected between a source of operating potential and the input of the circuit to be protected. Another variation includes a second pair of similarly connected N and P type MOSFETs with one pair connected between the input to be protected and the most negative source of operating potential while the second pair is connected between the most positive source of operating potential and the input to be protected.

6 Claims, 10 Drawing Figures

INPUT PROTECTION DEVICE FOR INSULATED GATE FIELD EFFECT TRANSISTOR

This invention relates to input protection devices and more particularly to an input protection configuration useful with complementary metal oxide semiconductor devices and complementary metal oxide semiconductor silicon-on-sapphire integrated circuits.

MOS (metal oxide semiconductor) devices, formed either in bulk silicon or in an island of silicon on a sapphire substrate (SOS), include a semiconductor substrate of a first conductivity. The substrate is provided with a substantially planar surface below which is formed spaced source and drain regions of an opposite conductivity. A layer of insulating material, usually thermally grown silicon dioxide, is disposed on the planar surface over the spaced (channel) region between the source and drain regions. A gate electrode that is insulated from the planar surface is formed over the layer of silicon dioxide and over the channel region with the gate electrode in field applying relation to the channel region.

The layer of silicon dioxide associated with the gate (gate oxide) typically has a breakdown strength of about $10^7$ volts/cm and consequently any transient voltage applied to the gate electrode that exceeds about 10 volts/100 Å of gate oxide thickness will probably cause the gate oxide to break down allowing the gate electrode to short circuit to the substrate. Voltages of at least this magnitude are often encountered by simple electrostatic accumulation on the human body and may be inadvertently applied to the devices during handling, for example, when inserting the completed device in a socket.

One of the early solutions proposed to protect insulated gate field effect transistor devices was to connect a diode between the gate electrode and the substrate. This protective diode is usually arranged to be back biased during normal operation of the device. However, when the gate voltage exceeds the breakdown voltage of the diode, conduction from the gate to the substrate will occur and thus, the diode provides a limit to the amount of voltage that can be applied to the gate. However, diode protection of this sort is limited to protection circuits wherein the devices to be protected are operated with gate voltages of a single polarity since any voltages of an opposite polarity that are applied to the gate would merely drive the diode in a forward direction.

In order to accomodate voltages of both polarities, the back-to-back diode arrangement is utilized in order to enable operation of the voltages of both polarities. One such back-to-back arrangement is shown in U.S. Pat. No. 3,512,058 which issued to H. Khajezadeh on May 12, 1970 and assigned to the same asignee of the subject application. In that reference, a protective circuit is described which protects the device against overvoltages and allows operation of the device with gate voltages of both positive and negative polarities. The back-to-back diodes shown therein are connected between the gate electrode and the substrate of the protected devices. Both diodes are formed by a pair of similar spaced regions within a single region in the first transistor.

Still another variation of the back-to-back diode arrangement appears in U.S. Pat. No. 3,712,995 issued to G. W. Steudel on Jan. 23, 1973 and also assigned to the same asignee as the subject application. In this latter reference a COS/MOS integrated circuit device is provided with a protection circuit which includes a diffused resistor formed at the same time as the source and drain regions of the transistor.

Still another protection circuit for insulated gate field effect transistors is described in U.S. Pat. No. 4,037,140 which issued to S. S. Eaton, Jr. on July 19, 1977 and assigned to the same assignee of the subject application. In this reference the gate of an insulated gate field effect transistor (IGFET) is connected directly to the input terminal of the circuit to be protected by means of first and second diodes connected between the point of operating potential and the point of reference potential respectively. The first diode is poled to conduct current in the forward direction when the potential at the gate is more positive than the operating potential. The second diode is poled to conduct current in the forward direction when the potential at the gate is more negative than the potential at the point of reference potential. Both diodes are formed of gated diodes. While the gated diode has improved current handling characters with relatively low leakage, with respect to the prior methods and circuit configurations as an input protection device it suffers in that it requires a relatively wide gate in order to be effective and thus will occupy a large amount of chip real estate than is desirable.

In order to conserve chip space that may be more advantageously used for other devices, the present invention proposes that the need for wide gate be eliminated in fabricating an input protection device while maintaining high current capability. It is, therefore, proposed that the width of all gates be maintained at less than about 1.0 μm and that the structure be formed of narrow gate N channel and P channel MOS/SOS transistors connected such that one terminal of the N channel device be connected to the most positive potential while one terminal of the P channel device be connected to the most negative potential and the remaining terminals of the P and N channel devices be connected together. The gates may be connected to each other and left floating for maximum protection.

IN THE DRAWINGS

Like reference characters denote like components.

While the foregoing exegesis will be presented in terms of using sapphire as an insulating substrate or carrier I do not wish to be so limited. Those skilled in the art will readily recognize that the use of the generic expression "silicon on sapphire" (SOS) is broad enough, and is so intended, to include spinel and monocrystalline beryllium oxide as appropriate insulating substrates.

Figure 1A:
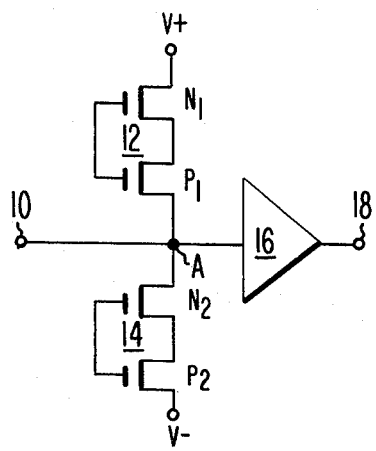
FIG. 1A is a schematic diagram of a circuit embodying the principles of my invention.

Referring now to FIG. 1A there is shown a schematic representation of my novel protective circuit. Protected device 16, having an input terminal 10 and an output terminal 18 is provided with protective devices 12 and 14 connected between the most positive source of operating potential V+ and the most negative source of operating potential V−. Device 12 is comprised of N channel field effect transistor $N_1$ and P channel field effect transistor $P_1$ connected in series with each other between V+ and node A. Device 14, identical in construction to device 12 is comprised of N channel and P channel series connected field effect transistors ($N_2$ and $P_2$ respectively) with $N_2$ connected to node A and $P_2$ connected to V−.

Figure 1B:
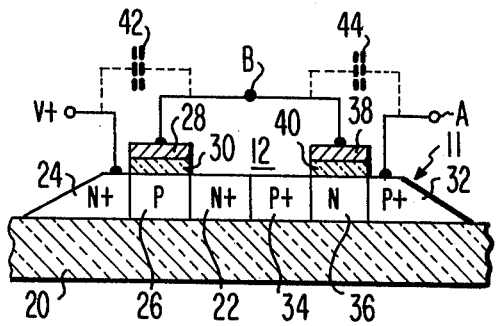
FIG. 1B is a cross-sectional view of one protective element of the circuit of FIG. 1A.

Referring now to FIG. 1B there is shown, by way of example, a cross-sectional view of the structure of protective device 12. Since protective devices 12 and 14 are identical in all respects, any description of protective device 12 will apply equally to protective device 14. In this figure an island of silicon is defined on an insulative substrate 20 (the formation of the island of silicon and the various portions thereof will be described in detail with regard to FIGS. 4A through 4E.) The silicon island consists of an NPN IGFET and a PNP IGFET forming $N_1$ and $P_1$. Source 24 is separated from drain 22 by channel region 26 while source 34 is separated from drain 32 by channel region 36. Channel region 26 is provided with gate insulator 30 and gate electrode 28 while a similar insulator 40 and gate electrode 38 are provided by channel region 36. In both instances, gate 28 and gate 38 are in field applying relationship to channels 26 and 36 respectively.

It should now be obvious that due to the presence of gate insulators 30 and 40, a capacitor 42 is created between gate electrode 28 and silicon body. A similar capacitor 44 appears in parallel with gate electrode 38 and the remainder of the body of semiconductor between gate electrode 38 and the connection to node A.

Figure 3:
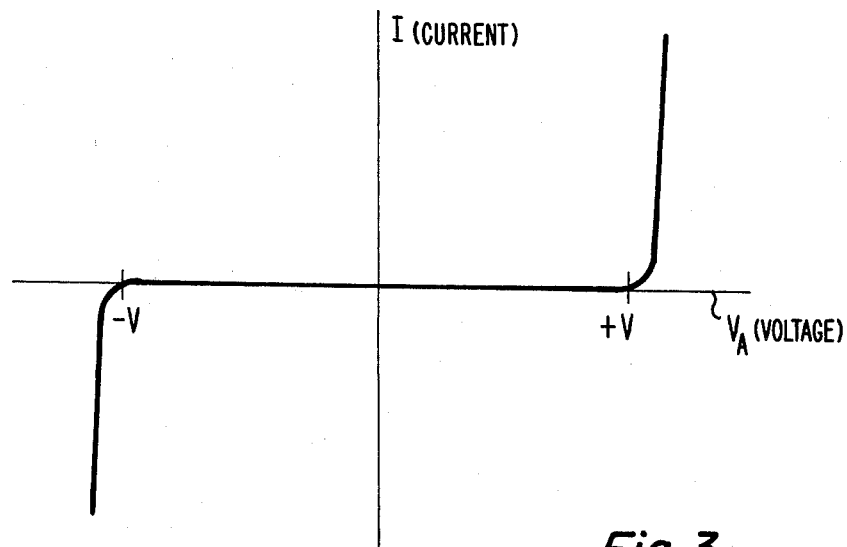
FIG. 3 is a plot of the voltage and current characteristics of the protective device of FIGS. 1A and 1B.

Referring now to FIG. 3, which together with FIGS. 1A and 1B, will facilitate the explanation of the operation of the protective device shown and described in FIGS. 1A and 1B. Since it is desired to protect the input circuit for device 16 when, for example, the voltage applied to input terminal 10 (node A) is more positive than the voltage appearing at V+ it will be seen that the voltage at node A ($V_A$) becomes more positive than the voltage at node B ($V_B$) while the voltage at node B will be more positive than voltage at V+. Thus, the voltage at node B may be expressed as $(V_A−(V+))/2$. Thus, the voltage $V_B$ is positive with respect to V+ causing transistor $N_1$ to turn on. Since the voltage at node B is negative with respect to the voltage at node A the $P_1$ transistor is turned on and, as soon as both $N_1$ and $P_1$ are conductive the current will flow from node A to V+. This is shown in FIG. 3 where the curve turns sharply upward just beyond V+.

Insofar as protective device 14 is concerned, a similar phenomenon takes places, that is, when $V_A$ is more negative than V−, the voltage at node B ($V_B$) is more positive than the voltage at node A. This causes transistor $N_2$ to become conductive. However, since voltage at node B is negative with respect to the voltage at V−, $P_2$ becomes conductive and protective device 14 allows current to flow from V− to node A. This is shown in more detail in FIG. 3 wherein when the voltage at node A becomes more negative than V− the protective device is conductive in a negative direction.

Figure 2A:
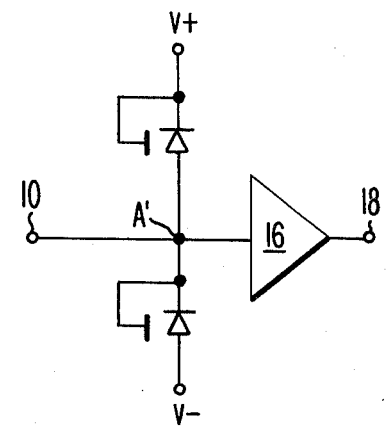
FIG. 2A is a schematic diagram of a gate diode circuit of the prior art.

Referring now to FIG. 2A there is shown one embodiment of the prior art wherein the protected device 16 is provided with an input terminal 10 and an output terminal 18. The protective devices are shown here as gated diodes 12' and 14' connected in series between V+ and V−. Similarly, the anode of gate diode 12' is connected to node A' while the cathode of gate diode 14' is connected to node A.

Figure 2B:
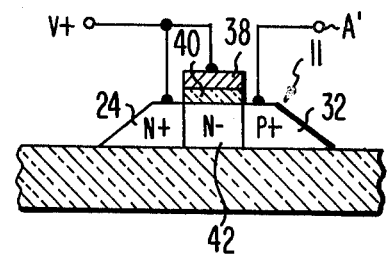
FIG. 2B is a cross-sectional view of a gated diode of the prior art.

The cross section representation of the circuit of FIG. 2A shown in detail in FIG. 2B wherein by way of example, the silicon island 11 consists of an N+ source 24, N-channel 42 and P+ drain 32. Channel region 42 is provided with a layer of gate insulator 40 and a gate electrode 38. However, as distinguished from the configuration shown in FIG. 1B, in the gated diode configuration of FIG. 2B the gate electrode 38 is connected directly to both the source region 24 and to V+ while P+ region 32 is connected to node A'. A similar configuration would be used for protective devices 14' in which event, gate electrode 38 and source region 24 would be connected to node A' while drain 32 would be connected to V−.

Figure 4A:
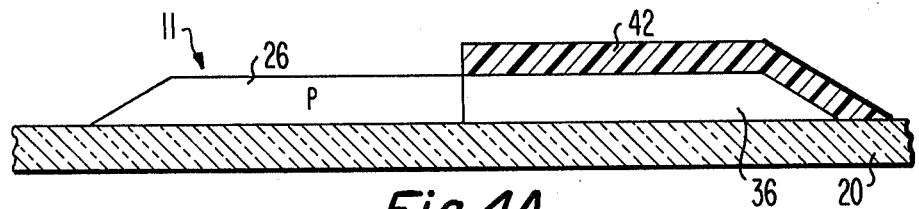
FIGS. 4A-4E are cross-sectional diagrams, in elevation of various stages of the formation of the protective element shown diagramatically in FIG. 1B.
Figure 4B:
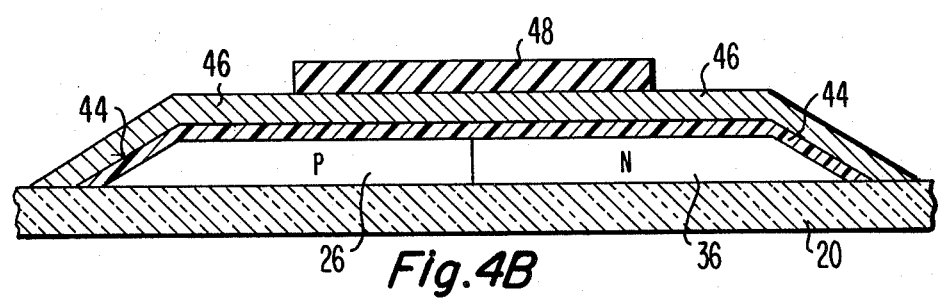

Referring now to FIGS. 4A–4E for a detailed description of one method of fabricating the present invention there is shown a body of substrate 20 of insulating material or a layer of such material on a substrate, depending on the device being made. In this particular embodiment, body 20 is a substrate of sapphire on which is deposited a layer of monocrystalline silicon. The monocrystalline silicon layer may be deposited by any of known techniques, such as the thermal decomposition of silane ($SiH_4$) diluted with hydrogen. A masking layer is then deposited over the polycrystalline layer the masking layer being of any material which would not be affected by any subsequent etching of the silicon layer and which is used to define the islands. Such masking layers may be silicon dioxide formed by the thermal decomposition of silane in an oxygen atmosphere. The unmasked areas are then etched down to the substrate with the unetched areas forming the island. The masking oxide is removed and, thereafter, as shown in FIG. 4A, a layer of photoresist material (not shown) is provided over a portion of the island using standard photolithographic techniques and the uncovered portion is then subjected to an N type dopant such as phosphorus to provide N region 36. The layer of photoresist is removed and a similar photoresist mask 42 is placed over the N region 36 after which, using P type dopant in the form of diborane, area 26 is formed.

Figure 4C:
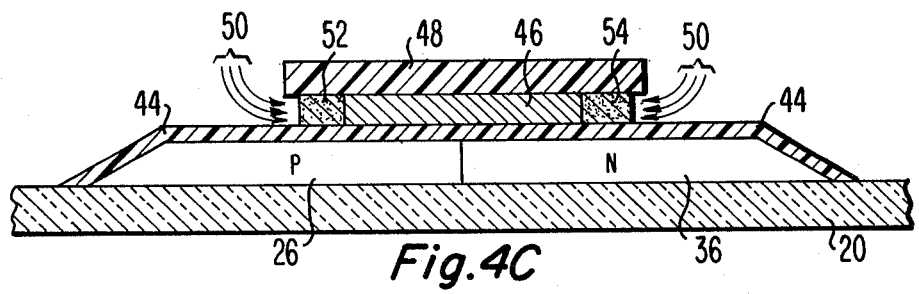
Figure 4D:
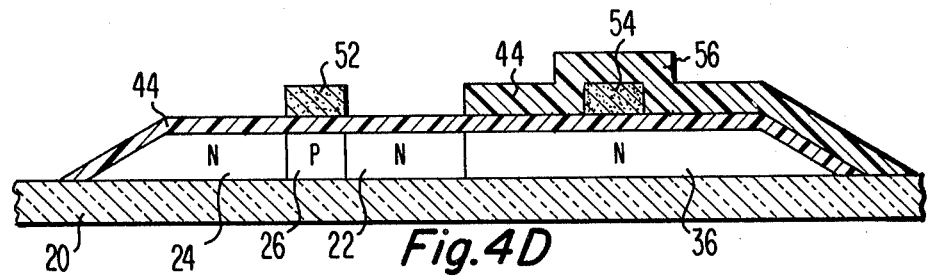

Having formed the P regions and N regions 26 and 36 respectively, in the silicon island, the photoresist layer 42 is removed and island 11 is then covered with a dielectric layer 44 preferably of silicon dioxide, such as by oxidizing the surface of the silicon island or by the thermal decomposition of silane in an oxygen atmosphere. Thereafter, a layer 46 of polycrystalline silicon is deposited over the oxide layer 44 and a masking layer 48, preferably of silicon nitride, is deposited over the polycrystalline silicon layer 46 as in FIG. 4B. A layer of patterned photoresist is then provided over layer 48 and the uncovered portions of layer 48 are then removed such as by etching with a Freon Plasma etchant. Using the now etched nitride layer 48 as a mask the unmasked portion of polycrystalline silicon layer 46 is now etched down to layer 44 by etching with an anisotropic etchant such as buffered KOH solution. In addition, the uncovered or exposed portions of polycrystalline silicon layer 46 will generally undercut the edge of masking layer 48. As shown in FIG. 4C the device is now subjected and exposed to a P type dopant and heated. As indicated by arrows 50 some of the dopant is caused to diffuse into the exposed edges of polycrystalline silicon layer 46 laterally along the polycrystalline silicon layer to form narrow strips 52 and 54 of P type doped polycrystalline silicon. The dopant, as indicated by the arrows 50, will diffuse into the exposed portion in a controlled manner and may be carefully monitored to provide any required thickness for strips 52 and 54.

Masking layer 48 is then removed and the undoped portion of the polycrystalline silicon layer 46 is etched with an etchant that does not attack the doped portions and instead leaves narrow strips 52 and 54. Such an etchant is described in U.S. Pat. No. 3,738,880 issued to A. Laker on June 13, 1973 and includes aqueous hydrazine or potassium hydroxide in proponal solution and the like. The use of any of these solutions of etchants will remove only the undoped porton 46 of the polycrystalline silicon leaving doped strips 52 and 54 unaffected.

Having now formed gates 52 and 54, N region 36 is masked with a photoresist masking material 56 and utilizing strip 52 as a mask, region 36 may be either implanted with N type conductivity modifiers such as by ion implantation in order to form drain 22 and source 24. Thereafter, masking material 56 is removed and the similar photoresist masking material is applied to the now formed N channel transistor after which N type material 36 is implanted using a P type conductivity modifier such as by ion implantation, in order to form drain 32 and source 34 in a manner similar to that described with regard to region 26.

Figure 4E:
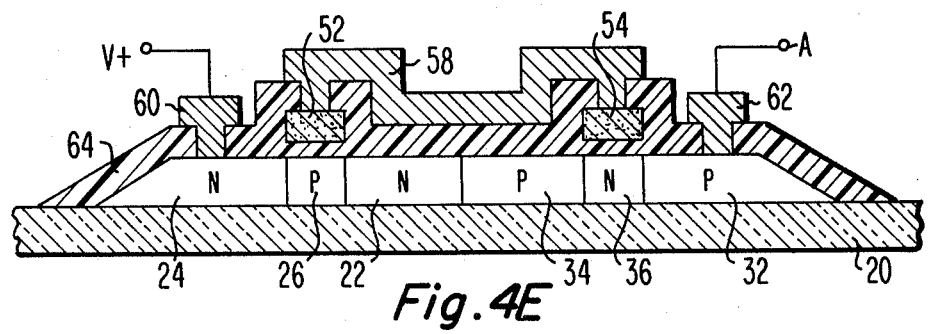

Thereafter, in order to complete the device, all masking material that may have remained in the surface of the silicon dioxide layer 44 is removed and field oxide 64 is grown over the gate oxide layer 44 as well as over gates 52 and 54 in a well known manner. Thereafter, the device is now masked with photoresist and contact openings formed for contact to drain 32, source 24 and gates 52 and 54. This is followed by the deposition of metallic contacts 60, 58 and 62 as shown in FIG. 4E.

What is claimed is:

1. An overvoltage protection circuit for the input of a field effect device to be protected, comprising:
   a pair of insulated gate transistors consisting of an N channel transistor and a P channel transistor, each transistor of the pair having a conduction path and a gate electrode;
   a source of operating potential;
   the N channel transistor connected to the source of operating potential;
   the P channel transistor connected to the input of the device to be protected;
   the conduction paths of each of the transistors connected in series between the source of operating potential and the input to the device to be protected; and
   means connecting the gate electrodes of each of the transistors to each other.

2. The input protection circuit of claim 1, wherein:
   the N channel transistor has a drain region and a source region of a first conductivity type with an intervening channel region therebetween of a second conductivity type; and
   the P channel transistor has a drain region and a source region of the second conductivity type with an intervening channel region of the first conductivity type.

3. The input protection circuit of claim 2, wherein:
   the source region of the N channel transistor is connected to the source of operating potential;
   the drain region of the N channel transistor is connected to the source region of the P channel transistor; and
   the drain region of the P channel transistor is connected to the input of the device to be protected.

4. An overvoltage protection circuit for the input of a field effect device to be protected, comprising:
   first and second pairs of insulated gate transistors each pair consisting of an N channel transistor and a P channel transistor, each transistor of each pair having a conduction path and a gate electrode;
   a source of positive operating potential;
   the N channel transistor of the first pair of transistors connected to the source of positive potential;
   the P channel transistor of the first pair of transistors connected to the input of the device to be protected;
   a source of negative operating potential;
   the conduction path of the first pair of insulated gate transistors connected in series between the source of positive potential and the input to the device to be protected;
   means connecting the gate electrodes of the first pair of insulated gate field effect transistors to each other;
   the N channel transistor of the second pair of transistors connected to the input of the device to be protected;
   the P channel transistor of the second pair of transistors connected to the source of negative potential;
   the conduction path of the second pair of insulated gate transistors connected in series between the input of the device to be protected and the source of negative potential; and
   means connecting the gate electrodes of the second pair of insulated gate transistors to each other.

5. The input protection circuit of claim 4, wherein:
   each N channel transistor of each pair of insulated gate transistors has a drain region and a source region of a first conductivity type with an intervening channel region therebetween of a second conductivity type; and
   each P channel transistor of each pair of insulated gate transistors has a drain region and a source region of the second conductivity type with an intervening channel region of the first conductivity type.

6. The input protection circuit of claim 5, wherein:
   the source region of the N channel transistor of the first pair of transistors is connected to the source of positive potential;
   the drain region of the N channel transistor of the first pair of insulated gate transistors is connected to the source region of the P channel transistor of the first pair of insulated gate transistors;
   the drain region of the P channel transistor of the first pair of insulated gate transistors is connected to the input of the device to be protected;
   the souce region of the N channel transistor of the second pair of insulated gate transistors is connected to the input of the device to be protected;
   the drain region of the N channel transistor of the second pair of insulated gate transistors is connected to the source region of the P channel insulated gate transistor of the second pair of transistors; and
   the drain region of the P channel transistor of the second pair of insulated gate transistors is connected to the source of negative potential.

* * * * *